US012604504B2

(12) United States Patent
Hell et al.

(10) Patent No.: US 12,604,504 B2
(45) Date of Patent: Apr. 14, 2026

(54) SHIELDING STRUCTURE FOR SILICON CARBIDE DEVICES

(71) Applicant: Infineon Technologies AG, Neubiberg (DE)

(72) Inventors: Michael Hell, Erlangen (DE); Caspar Leendertz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 963 days.

(21) Appl. No.: 17/533,513

(22) Filed: Nov. 23, 2021

(65) Prior Publication Data

US 2023/0163174 A1     May 25, 2023

(51) Int. Cl.
| | |
|---|---|
| *H10D 62/832* | (2025.01) |
| *H01L 21/04* | (2006.01) |
| *H10D 62/10* | (2025.01) |
| *H10D 62/17* | (2025.01) |

(52) U.S. Cl.
CPC ....... *H10D 62/8325* (2025.01); *H01L 21/046* (2013.01); *H10D 62/102* (2025.01); *H10D 62/393* (2025.01)

(58) Field of Classification Search
CPC .............. H01L 29/1608; H01L 21/046; H01L 29/0607; H01L 29/1095
See application file for complete search history.

(56) References Cited

U.S. PATENT DOCUMENTS

| | | | |
|---|---|---|---|
| 9,136,372 B2 | 9/2015 | Miyahara et al. | |
| 10,886,370 B2 | 1/2021 | Grasse et al. | |
| 11,552,173 B2 | 1/2023 | Leendertz et al. | |
| 2007/0114602 A1 | 5/2007 | Saito et al. | |
| 2009/0114969 A1 | 5/2009 | Suzuki et al. | |
| 2011/0018029 A1 | 1/2011 | Pfirsch et al. | |
| 2012/0104555 A1 | 5/2012 | Bobde et al. | |
| 2014/0021484 A1 | 1/2014 | Siemieniec et al. | |
| 2016/0172468 A1 | 6/2016 | Esteve et al. | |
| 2017/0345905 A1 | 11/2017 | Siemieniec et al. | |
| 2018/0175150 A1 | 6/2018 | Mauder et al. | |
| 2018/0175153 A1 | 6/2018 | Schulze et al. | |
| 2018/0308938 A1 | 10/2018 | Siemieniec et al. | |

(Continued)

FOREIGN PATENT DOCUMENTS

| | | |
|---|---|---|
| CN | 110036461 A | 7/2019 |
| DE | 102010027886 A1 | 11/2010 |

(Continued)

*Primary Examiner* — Trang Q Tran

(74) *Attorney, Agent, or Firm* — Murphy, Bilak & Homiller, PLLC

(57) ABSTRACT

A silicon carbide device includes: a planar gate structure on a first surface of a silicon carbide substrate, the planar gate structure having a gate length along a lateral first direction; a source region of a first conductivity type extending under the planar gate structure over at least part of the gate length; a body region of a second conductivity type, the body region including a channel zone that adjoins the source region under the planar gate structure; and a shielding region of the second conductivity type covering the channel zone over at least 20% but less than 100% of the gate length, wherein a maximum dopant concentration in the shielding region is higher than a maximum dopant concentration in the body region.

22 Claims, 12 Drawing Sheets

(56) References Cited

U.S. PATENT DOCUMENTS

| | | | |
|---|---|---|---|
| 2019/0081170 A1* | 3/2019 | Kumagai | H01L 27/088 |
| 2019/0172910 A1 | 6/2019 | Siemieniec et al. | |
| 2019/0296141 A1 | 9/2019 | Rupp et al. | |
| 2020/0098869 A1 | 3/2020 | Schulze et al. | |
| 2020/0219978 A1 | 7/2020 | Guler et al. | |
| 2021/0050421 A1 | 2/2021 | Leendertz et al. | |

FOREIGN PATENT DOCUMENTS

| | | |
|---|---|---|
| DE | 102017110969 A1 | 11/2017 |
| DE | 102016124973 A1 | 6/2018 |
| DE | 102017110508 A1 | 11/2018 |
| JP | 2018195782 A | 12/2018 |

* cited by examiner

100

104

106

132

113

122, 122a 124, 124b

136

125

126

118

120

117

111

114, 114a 116, 116a

110

112

108

134

130

102

200 x z

104

106

132

122

124, 124a

136

113

125

126

118

120

111

117

110  112

114

116, 116a

134

108

130

102

200 x z

108

110

112

113

111

114

116, 116a

134

130

128

126

118

120

122

124, 124a

136

104

132

106

102

300

102

130    134    116, 116a    114    128, 128a    126    128, 128b    124, 124a    122    132    136    118    120

110    112    108    111    113

104    106 x    z

SHIELDING STRUCTURE FOR SILICON CARBIDE DEVICES

BACKGROUND

SiC (silicon carbide) power devices provide reduced drift-zone resistance compared to Si (silicon) power devices, since SiC power devices can tolerate larger electrical fields before breakdown occurs. Due to these larger electric fields, proper shielding of, e.g., the gate dielectric from high electric fields within SiC power FETs (field-effect transistors) such as MOSFETs (metal-oxide-semiconductor field-effect transistors), JFETs (junction FETs), FinFETs (fin FETs) is a limiting factor in achieving long-term reliability. Proper shielding may also reduce Cgd (gate-to-drain capacitance) for better performance or instead may increase Cgd to avoid parasitic turn on, reduce saturation current for improved short-circuit capability, etc.

Thus, there is a need for an improved shielding structure for SiC devices.

SUMMARY

According to an embodiment of a silicon carbide (SiC) device, the SiC device comprises: a planar gate structure on a first surface of a silicon carbide substrate, the planar gate structure having a gate length along a lateral first direction; a source region of a first conductivity type extending under the planar gate structure over at least part of the gate length; a body region of a second conductivity type, the body region including a channel zone that adjoins the source region under the planar gate structure; and a shielding region of the second conductivity type covering the channel zone over at least 20% but less than 100% of the gate length, wherein a maximum dopant concentration in the shielding region is higher than a maximum dopant concentration in the body region.

According to another embodiment of a SiC device, the SiC device comprises: a planar gate structure on a first surface of a silicon carbide substrate, the planar gate structure having a gate length along a lateral first direction; a first source region of a first conductivity type extending under a first side of the planar gate structure over at least part of the gate length; a first body region of a second conductivity type, the first body region including a channel zone that adjoins the first source region under the planar gate structure; a second source region of the first conductivity type extending under a second side of the planar gate structure opposite the first side over at least part of the gate length; a second body region of the second conductivity type, the second body region including a channel zone that adjoins the second source region under the planar gate structure; a current spreading region of the first conductivity type separating the channel zone of the first body region and the channel zone of the second body region from one another under the planar gate structure; and a shielding region of the second conductivity type covering both the channel zone of the first body region and the channel zone of the second body region over at least 20% but less than 100% of the gate length.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a top plan view of the planar gate SiC device in the region of a transistor cell, FIG. 1B illustrates a cross-sectional view along the line labelled A-A' in FIG. 1A, and FIG. 1C illustrates a cross-sectional view along the line labelled B-B' in FIG. 1A.

FIG. 2A illustrates a top plan view of the planar gate SiC device in the region of a transistor cell, FIG. 2B illustrates a cross-sectional view along the line labelled A-A' in FIG. 2A, and FIG. 2C illustrates a cross-sectional view along the line labelled B-B' in FIG. 2A.

FIG. 3A illustrates a top plan view of the planar gate SiC device in the region of a transistor cell, FIG. 3B illustrates a cross-sectional view along the line labelled A-A' in FIG. 3A, and FIG. 3C illustrates a cross-sectional view along the line labelled B-B' in FIG. 3A.

FIG. 4A illustrates a top plan view of the planar gate SiC device in the region of a transistor cell, FIG. 4B illustrates a cross-sectional view along the line labelled A-A' in FIG. 4A, and FIG. 4C illustrates a cross-sectional view along the line labelled B-B' in FIG. 4A.

DETAILED DESCRIPTION

Described herein is a shielding structure for planar gate silicon carbide (SiC) devices. The planar gate SiC devices that utilize the shielding structure may have high voltage blocking capability of at least 30 V, e.g., 100 V, 600 V, 3.3 kV or more and with a nominal on-state current or forward current of at least 1 A, e.g., 10 A or more. In a planar gate SiC device, the gate structure is disposed on a main surface of a silicon carbide substrate instead of in a trench etched into the silicon carbide substrate. Under each planar gate structure, the shielding structure covers the channel zone of the body region over at least 20% but less than 100% of the gate length. The shielding structure may vertically adjoin a buried shielding region of the same conductivity type to provide 3-dimensional shielding.

The 3-dimensional shielding may protect the planar gate structure from high electric fields, allowing for high voltage blocking capability without reducing on-state resistance. Separately or in combination, the 3-dimensional shielding may improve the definition of the channel zones under the planar gate structure, allowing for reduced channel widths. Accordingly, the term 'shielding region' as used herein refers to a region that shields a gate dielectric from high electric fields and/or to a region that reduces channel width and/or to a region that modifies Cgd and/or to a region that reduces saturation current. In each case, the beneficial 'shielding' is provided by a p-type region for an n-channel device or an n-type region for a p-channel device and that prevents current flow (i.e., the formation of a channel) in a targeted part of the body to effectively reduce the channel width.

Described next in more detail are various embodiments of the shielding structure for planar gate SiC devices. While the shielding structure is described in the context of SiC as the base semiconductor material, other types of wide-bandgap semiconductors may be used instead of SiC. The term 'wide-bandgap semiconductor' as used herein refers to any semiconductor material having a bandgap greater than 1.5 eV. For example, the term 'wide-bandgap semiconductor' includes SiC and GaN (gallium nitride). Still other wide-bandgap semiconductor materials may be used. In the following embodiments, the first conductivity is n-type and the second conductivity type is p-type for an n-channel device and the first conductivity is p-type and the second conductivity type is n-type for a p-channel device.

Figure 1A:
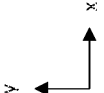
FIGS. 1A through 1C illustrate partial views of an embodiment of a planar gate silicon carbide (SiC) device having a shielding structure, where
Figure 1A:
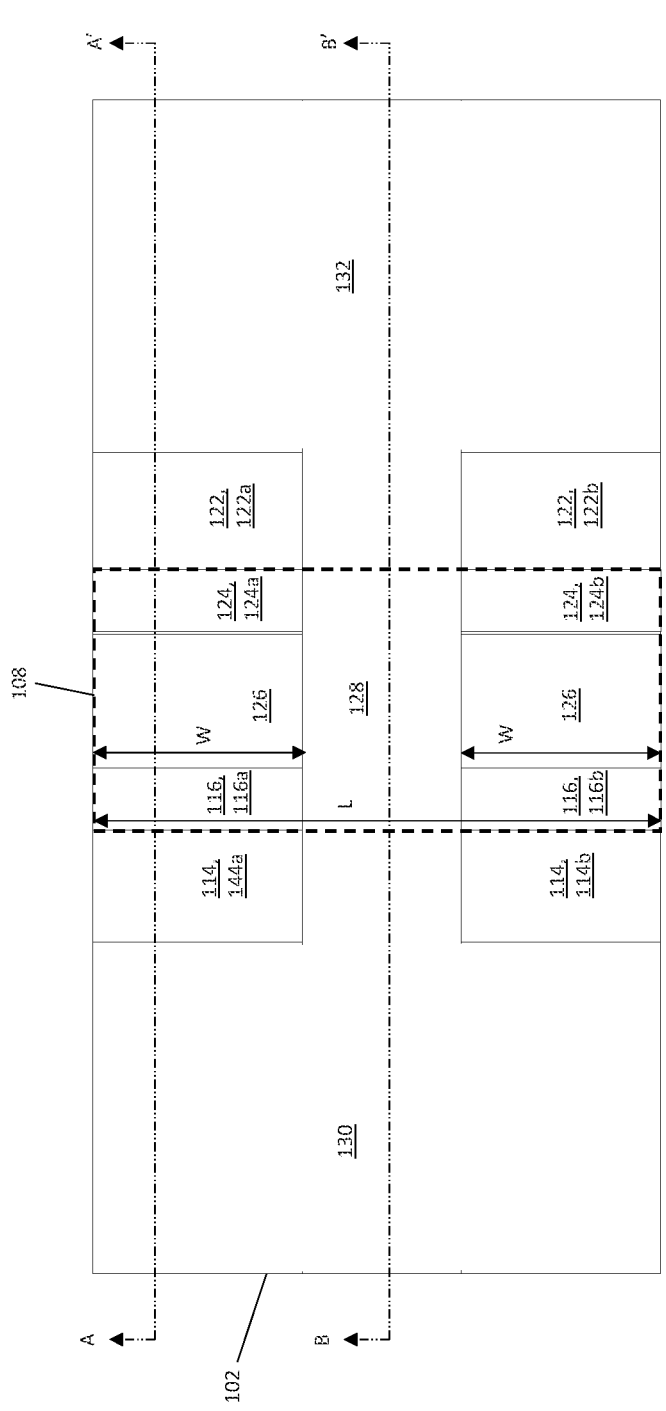

FIGS. 1A through 10 illustrate partial views of an embodiment of a planar gate SiC device 100 that includes the shielding structure. FIG. 1A illustrates a top plan view of the planar gate SiC device 100 in the region of a transistor cell. FIG. 1B illustrates a cross-sectional view along the line labelled A-A' in FIG. 1A. FIG. 10 illustrates a cross-sectional view along the line labelled B-B' in FIG. 1A.

The planar gate SiC device 100 includes a SiC substrate 102 having a first main surface 104 and a second main surface 106 opposite the first main surface 104. The SiC substrate 102 may include single crystalline silicon carbide, e.g., a silicon carbide crystal including silicon and carbon as the main constituents. The silicon carbide crystal may include unwanted impurities like hydrogen, and/or oxygen, etc. and/or intended impurities, e.g., dopant atoms. The polytype of the silicon carbide crystal may be 15R or may be hexagonal, e.g., 2H, 6H, or 4H. The SiC substrate 102 may include a base semiconductor and one or more epitaxial layers grown on the base semiconductor.

A planar gate structure 108 formed on the first main surface 104 of the SiC substrate 102 is subject to an electric field during operation of the SiC device 100. The planar gate structure 108 may be stripe-shaped and is illustrated as a dashed rectangle in FIG. 1A to provide an unobstructed view of the device regions underlying the planar gate structure 108 in the SiC substrate 102.

The planar gate structure 108 has a gate length 'L' along a lateral first direction y. The gate length L may be up to several millimeters (mm), for example. Only part of the gate length L is shown in FIG. 1A, and the planar gate SiC device 100 may include tens, hundreds, thousands or more planar gate structures 108 on the first main surface 104 of the SiC substrate 102 and therefore may include tens, hundreds, thousands or more transistor cells. The transistor cells are electrically coupled in parallel to form a power transistor such as a power MOSFET, JFET, FinFET, etc.

In the case of a power MOSFET or FinFET, each planar gate structure 108 includes a gate electrode 110 separated from the first main surface 104 of the SiC substrate 102 by a gate dielectric 112. In the case of a JFET, the gate dielectric 112 is omitted and the gate electrode 110 directly adjoins the first main surface 104 of the SiC substrate 102.

Each transistor cell also includes a first source region 114 of a first conductivity type extending under a first side 111 of the planar gate structure 108 over at least part of the gate length L and a first body region 116 of a second conductivity type. The first body region 116 includes a channel zone 117 that laterally adjoins the first source region 114 under the planar gate structure 108. The first body region 116 separates the first source region 114 from an underlying drift zone 118 of the first conductivity type. The drift zone 118 forms a voltage sustaining structure, wherein a vertical extension and a dopant concentration in the drift zone 118 may be selected such that the SiC device 100 provides a nominal blocking voltage capability in an off state of the SiC device 100. The drift zone 118 may be formed in a layer grown by epitaxy. A mean (average) dopant concentration in the drift zone 118 may be, e.g., in a range from 1E15 cm$^{-3}$ to 5E16 cm$^{-3}$. Separately or in combination, the drift zone 118 may include a compensation structure such as a superjunction structure.

A heavily doped contact zone 120 may be formed between the drift zone 118 and a rear side electrode (not shown) that directly adjoins the second main surface 106 of the SiC substrate 102. The heavily doped contact zone 120 and the rear side electrode form a low-resistive ohmic contact. The heavily doped contact zone 120 may have the same conductivity type as the drift zone 118, the opposite conductivity type, or may include zones of both conductivity types. For example, the heavily doped contact zone 120 may for a drain region of a power MOSFET, JFET of FinFET, or a collector region of an IGBT (insulated gate bipolar transistor).

Each transistor cell may also include a second source region 122 of the first conductivity type extending under a second side 113 of the planar gate structure 108 laterally opposite the first side 111 over at least part of the gate length L and a second body region 124 of the second conductivity type. The second body region 124 includes a channel zone 125 that laterally adjoins the second source region 122 under the planar gate structure 108. The second body region 124 separates the second source region 122 from the drift zone 118.

A channel region forms in the channel zone 117, 125 of each body region 116, 124 along the first main surface 104 of the SiC substrate 102 when an appropriate voltage is applied to the gate electrode 110. Current flows when the channel region is formed, as indicated by the dashed arrows in FIG. 1B. The current flow includes a lateral component in the channel zones 117, 125 and a vertical component through a current spreading region 126 of the first conductivity type and into the drift zone 118.

The current spreading region 126 separates the channel zones 117, 125 of the body regions 116, 124 from one another under the planar gate structure 108. The current spreading region 126 has a higher mean dopant concentration than the drift zone 118 and may facilitate a better lateral spreading of the on-state current exiting the channel zones 117, 125, provide improved channel control, and allow for a reduced channel width 'W' in the lateral first direction y. The current spreading region 126 is formed under the planar gate structure 108 and adjoins a side of the first channel zone 117 opposite the first source region 114, such that the first channel zone 117 is delimited on one side by the first source region 114 and on an opposite side by the current spreading region 126. The current spreading region 126 likewise adjoins a side of the second channel zone 125 opposite the second source region 122, such that the second channel zone 125 is delimited on one side by the second source region 122 and on an opposite side by the current spreading region 126. The current spreading region 126 extends from the first main surface 104 of the SiC substrate 102 to the drift zone 118 of the SiC substrate 102. The drift zone 118 laterally extends under each source region 114, 122 and under each body region 116, 124 of the SiC device 100.

The planar gate SiC device 100 also includes a shielding region 128 of the second conductivity type. The shielding region 128 covers both the channel zone 117 of the first body region 116 and the channel zone 125 of the second body region 124 over at least 20% but less than 100% of the gate length L. For example, the shielding region 128 covers both the channel zone 117 of the first body region 116 and the channel zone 125 of the second body region 124 over at least 30% but less than 100% of the gate length L. In another example, the shielding region 128 covers both the channel zone 117 of the first body region 116 and the channel zone 125 of the second body region 124 over at least 50% but less than 100% of the gate length L.

A maximum dopant concentration and/or an average (mean) doping concentration in the shielding region 128 may be higher than a maximum dopant concentration and/or an average (mean) doping concentration in either body region 116, 124. The maximum and average dopant concentrations in the shielding region 128 and body regions 116, 124 may be determined by the respective implantation doses used during formation of the shielding region 128 and the body regions 116, 124.

The planar gate SiC device 100 may also include a first body contact region 130 of the second conductivity type adjoining both the first body region 116 and the first source region 114 at a side of the first source region 114 opposite the shielding region 128, and a second body contact region 132 of the second conductivity type adjoining both the second body region 124 and the second source region 122 at a side of the second source region 122 opposite the shielding region 128. The body contact regions 130, 132 have a higher maximum dopant concentration and/or an average (mean) doping concentration than the body regions 116, 124 to provide an ohmic connection to an overlying metallization (not shown in FIGS. 1A through 1C).

The planar gate SiC device 100 may also include a first buried shielding region 134 of the second conductivity type under both the first body region 116 and the first source region 114, and a second buried shielding region 136 of the second conductivity type under both the second body region 124 and the second source region 122. A maximum dopant concentration and/or an average (mean) doping concentration in the first buried shielding region 134 is higher than the maximum dopant concentration and/or the average (mean) doping concentration in the first body region 116. A maximum dopant concentration and/or an average (mean) doping concentration in the second buried shielding region 136 is higher than the maximum dopant concentration and/or the average (mean) doping concentration in the second body region 124. The maximum and average (mean) doping concentrations in the buried shielding regions 134, 136 and body regions 116, 124 are determined by the respective implantation doses used during formation of the buried shielding regions 134, 136 and the body regions 116, 124.

Figure 1B:
Figure 1C:
Figure 1C:

The shielding region 128 and the first buried shielding region 134 may vertically adjoin one another as shown in FIG. 1C, to provide shielding along the first side 111 of the planar gate structure 108 in each of the lateral first direction y, a lateral second direction x orthogonal to the lateral first direction y, and a vertical direction z orthogonal to both the lateral first direction y and the lateral second direction z. The shielding region 128 and the second buried shielding region 136 also may vertically adjoin one another to provide shielding along the second side 113 of the planar gate structure 108 in each of the lateral first direction y, the lateral second direction x, and the vertical direction z. Accordingly, three-dimensional shielding is provided if the planar gate SiC device 100 includes the buried shielding regions 134, 136.

According to the embodiment illustrated in FIGS. 1A through 1C, the shielding region 128 extends through both the first source region 114 and the second source region 122 in the lateral second direction x such that the first source region 114 and the second source region 122 are each segmented into a plurality of sections 114a, 114b, 122a, 122b that are separated from one another by the shielding region 128 over at least part of the gate length L. Two such first source region sections 114a, 114b and two such second source region sections 122a, 122b are shown in FIG. 1A. However, as explained above, FIGS. 1A through 1C illustrate only part of the planar gate SiC device 100. The gate length L may be longer than illustrated and both the first source region 114 and the second source region 122 formed under the same planar gate structure 108 may be segmented into more than two sections 114a, 114b, 122a, 122b that are separated from one another by the shielding region 128 over at least part of the gate length L. Depending on the depth of the shielding region 128, the first body region 116 and the second body region 124 each may be segmented into a plurality of sections 116a, 116b, 124a, 124b that are separated from one another by the shielding region 128 over at least part of the gate length L.

The source regions 114, 122 under different planar gate structures 108 may be arranged according to a grid layout. For example, the source region sections 114a, 114b, 122a, 122b for different planar gate structures 108 may be arranged matrix-like in lines and rows, wherein the rows run orthogonal to the lines. In other words, the source region sections 114a, 114b, 122a, 122b for different planar gate structures 108 may be formed in the black and in the white fields of a checkerboard. In another example, the source region sections 114a, 114b, 122a, 122b for neighboring planar gate structures 108 may be shifted to each other by half the center-to-center distance between neighboring source region sections 114a, 114b, 122a, 122b along the lateral first direction y. In other words, the source region sections 114a, 114b, 122a, 122b for neighboring planar gate structures 108 may be formed only in the 'white' fields of a checkerboard.

As shown in FIGS. 1A and 1C, the shielding region 128 may merge both with the first body contact region 130 between the sections 114a, 114b of the first source region 114 and with the second body contact region 132 between the sections 122a, 122b of the second source region 122. Depending on the doping profiles of the shielding region 128 and the body contact regions 130, 132, there may be no distinguishable interface where the shielding region 128 merges with the respective body contact regions 130, 132. Separately or in combination, the shielding region 128 may extend through the current spreading region 126 in the lateral second direction x as shown in FIGS. 1A and 1C, such that the shielding region 128 extends uninterrupted between the first body contact region 130 and the second body contact region 132 in the lateral second direction x.

Figure 2A:
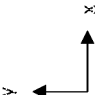
FIGS. 2A through 2C illustrate partial views of another embodiment of a planar gate SiC device having a shielding structure, where
Figure 2A:
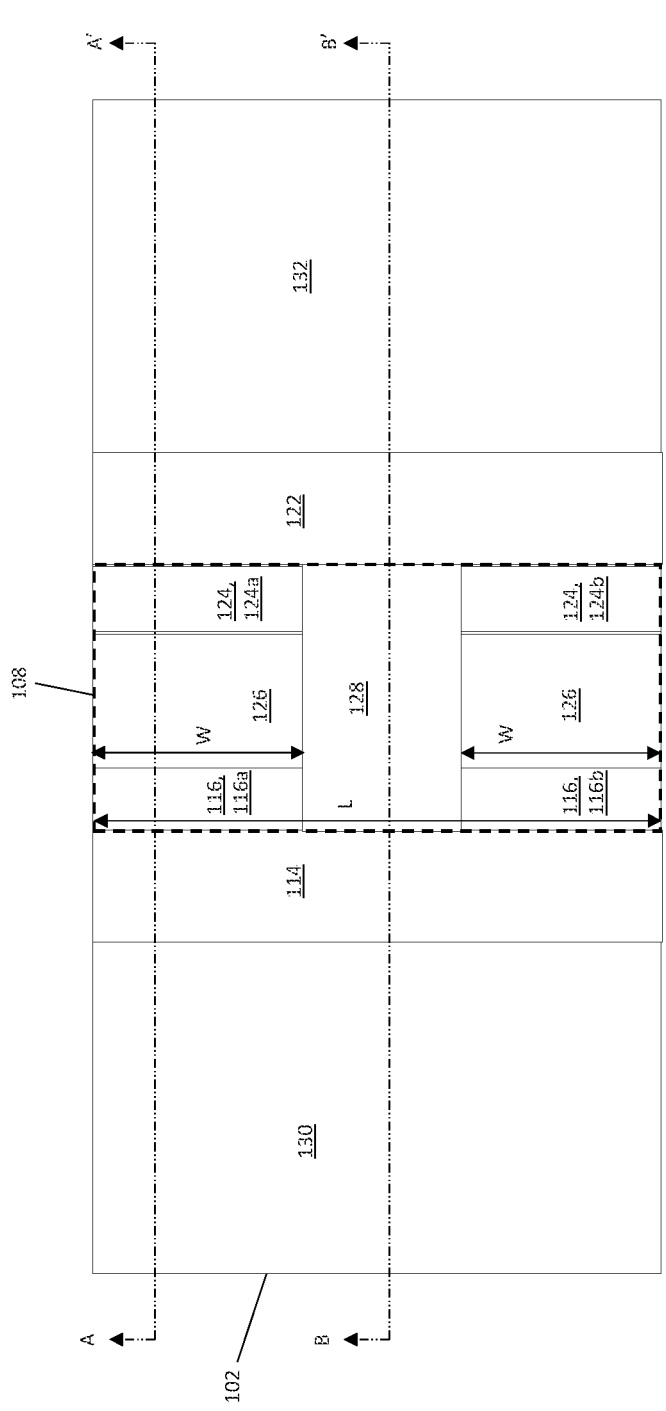
Figure 2B:
Figure 2C:

FIGS. 2A through 2C illustrate partial views of another embodiment of a planar gate SiC device 200 that includes the shielding structure. FIG. 2A illustrates a top plan view of the planar gate SiC device 200 in the region of a transistor cell. FIG. 2B illustrates a cross-sectional view along the line labelled A-A' in FIG. 2A. FIG. 2C illustrates a cross-sectional view along the line labelled B-B' in FIG. 2A.

As shown in FIGS. 2A and 2C, both the first source region 114 and the second source region are uninterrupted by the shielding region 128 over the gate length L. According to this embodiment, the shielding region 128 is delimited on one side by the first source region 114 and on an opposite side by the second source region 122. Separately or in combination, the shielding region 128 may extend through the current spreading region 126 in the lateral second direction x, such that the shielding region 128 extends uninterrupted between the first source region 114 and the second source region 122 in the lateral second direction x.

Figure 3A:
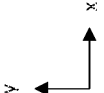
FIGS. 3A through 3C illustrate partial views of another embodiment of a planar gate SiC device having a shielding structure, where
Figure 3A:
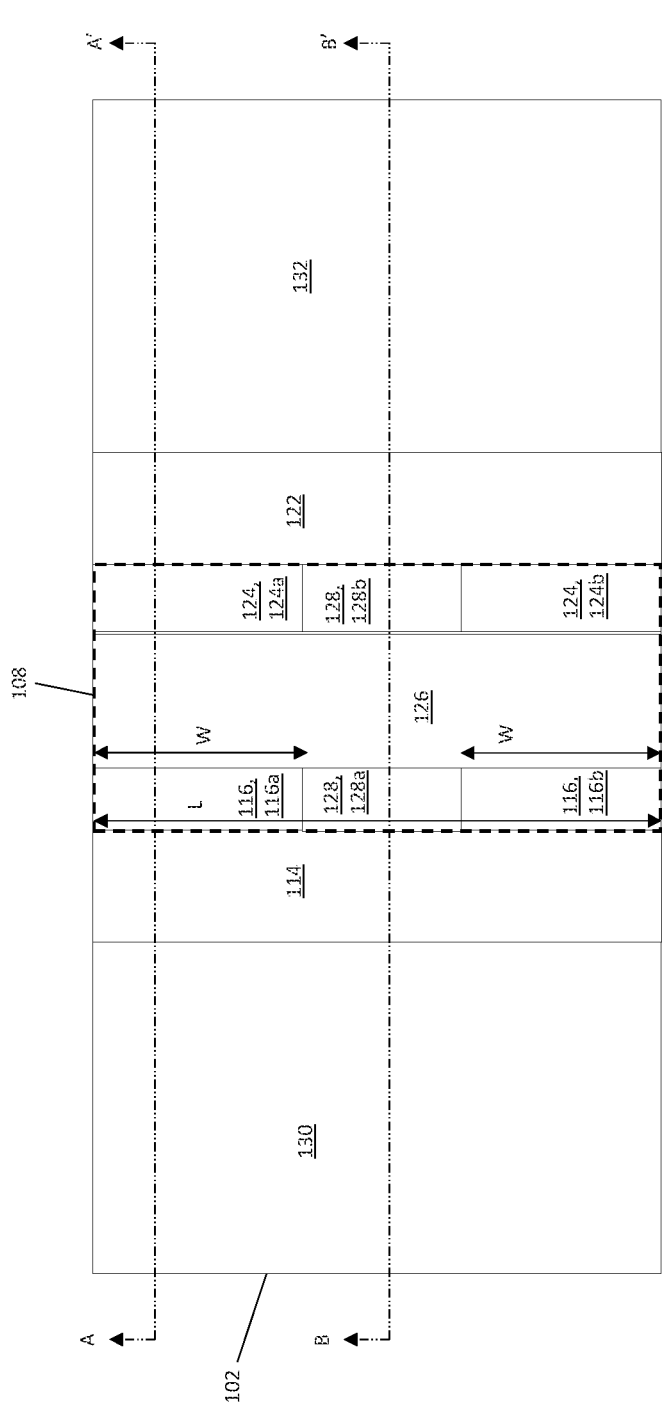
Figure 3B:
Figure 3C:

FIGS. 3A through 3C illustrate partial views of another embodiment of a planar gate SiC device 300 that includes the shielding structure. FIG. 3A illustrates a top plan view of the planar gate SiC device 300 in the region of a transistor cell. FIG. 3B illustrates a cross-sectional view along the line labelled A-A' in FIG. 3A. FIG. 3C illustrates a cross-sectional view along the line labelled B-B' in FIG. 3A.

As shown in FIGS. 3A and 3C, both the first source region 114 and the second source region are uninterrupted by the shielding region 128 over the gate length L and the current spreading region 126 separates the shielding region 128 into a first section 128a and a second section 128b. The first section 128a of the shielding region 128 is delimited on one side by the first source region 114 and on an opposite side by the current spreading region 128. The second section 128b of the shielding region 128 is delimited on one side by the second source region 122 and on an opposite side by the current spreading region 126. One pair of separated shielding region sections 128a, 128b is shown in FIG. 3A. However, as explained above, FIGS. 3A through 3C illustrate only part of the planar gate SiC device 300. The gate length L may be longer than illustrated and the shielding region 128 may be segmented into more than one pair of sections 128a, 128b that are separated from one another by the current spreading region 126 over at least part of the gate length L.

Figure 4A:
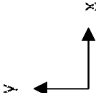
FIGS. 4A through 4C illustrate partial views of another embodiment of a planar gate SiC device having a shielding structure, where
Figure 4A:
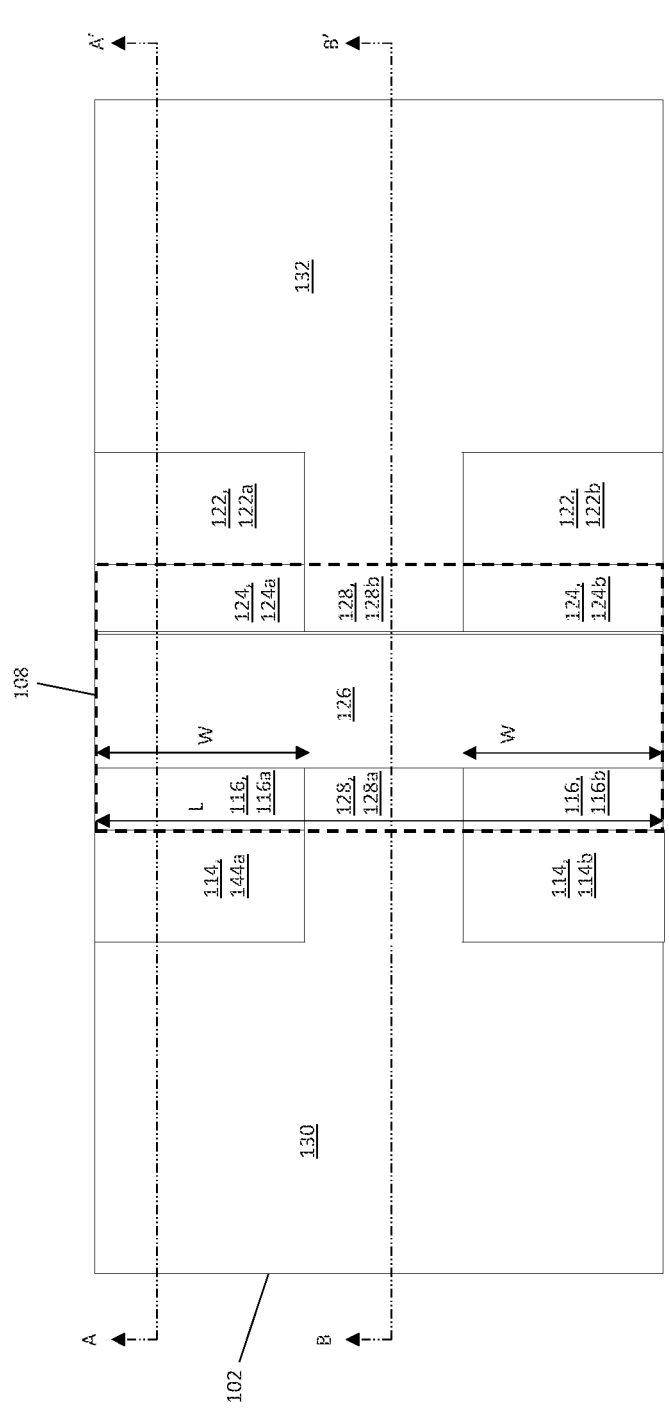
Figure 4B:
Figure 4C:

FIGS. 4A through 4C illustrate partial views of another embodiment of a planar gate SiC device 400 that includes the shielding structure. FIG. 4A illustrates a top plan view of the planar gate SiC device 400 in the region of a transistor cell. FIG. 4B illustrates a cross-sectional view along the line labelled A-A' in FIG. 4A. FIG. 4C illustrates a cross-sectional view along the line labelled B-B' in FIG. 4A.

As shown in FIGS. 4A and 4C, the current spreading region 126 separates the shielding region 128 into a first section 128a and a second section 128b. The first section 128a of the shielding region 128 extends from the current spreading region 128 through the first source region 114 in the lateral second direction x such that the first source region 114 is segmented into a plurality of sections 114a, 114b that are separated from one another by the first section 128a of the shielding region 128 over at least part of the gate length L. The second section 128b of the shielding region 128 extends from the current spreading region 128 through the second source region 122 in the lateral second direction x such that the second source region 122 is segmented into a plurality of sections 122a, 112b that are separated from one another by the second section 128b of the shielding region 128 over at least part of the gate length L. The first section 128a of the shielding region 128 may merge with the first body contact region 130 between the sections 114a, 114b of the first source region 114 and the second section 128b of the shielding region 128 may merge with the second body contact region 132 between the sections 122a, 122b of the second source region 122. As explained above, depending on the doping profiles of the shielding region 128 and the body contact regions 130, 132, there may be no distinguishable interface where the first section 128a of the shielding region 128 merges with the first body contact region 130 and/or where the second section 128b of the shielding region 128 merges with the second body contact region 132. Also as explained above, the shielding region 128 may be segmented into more than one pair of sections 128a, 128b that are separated from one another by the current spreading region 126 over at least part of the gate length L. Accordingly, the shielding region 128 may segment each source region 114, 122 into more than two separated sections 114a, 114b, 122a, 122b over the gate length L.

Although the present disclosure is not so limited, the following numbered examples demonstrate one or more aspects of the disclosure.

Example 1. A silicon carbide device, comprising: a planar gate structure on a first surface of a silicon carbide substrate, the planar gate structure having a gate length along a lateral first direction; a source region of a first conductivity type extending under the planar gate structure over at least part of the gate length; a body region of a second conductivity type, the body region including a channel zone that adjoins the source region under the planar gate structure; and a shielding region of the second conductivity type covering the channel zone over at least 20% but less than 100% of the gate length, wherein a maximum dopant concentration in the shielding region is higher than a maximum dopant concentration in the body region.

Example 2. The silicon carbide device of example 1, wherein the shielding region extends through the source region in a lateral second direction orthogonal to the lateral first direction, such that the source region is segmented into a plurality of sections that are separated from one another by the shielding region over at least part of the gate length.

Example 3. The silicon carbide device of example 2, further comprising: a body contact region of the second conductivity type adjoining both the body region and the source region at a side of the source region opposite the shielding region, wherein a maximum dopant concentration in the body contact region is higher than a maximum dopant concentration in the body region, wherein the shielding region merges with the body contact region between the sections of the source region.

Example 4. The silicon carbide device of example 1, wherein the source region is uninterrupted by the shielding region over the gate length, such that the shielding region is delimited on one side by the source region.

Example 5. The silicon carbide device of any of examples 1 through 4, further comprising: a current spreading region of the first conductivity type under the planar gate structure and adjoining a side of the channel zone opposite the source region, such that the channel zone is delimited on one side by the source region and on an opposite side by the current spreading region, wherein the current spreading region extends from the first surface to a drift zone of the silicon carbide substrate, wherein the drift zone extends under both the body region and the source region.

Example 6. The silicon carbide device of example 5, wherein the shielding region extends through the current spreading region in a lateral second direction orthogonal to the lateral first direction.

Example 7. The silicon carbide device of example 5, wherein the shielding region is delimited on one side by the source region and on an opposite side by the current spreading region.

Example 8. The silicon carbide device of any of examples 1 through 7, further comprising: a buried shielding region of the second conductivity type under both the body region and the source region, wherein a maximum dopant concentration in the buried shielding region is higher than the maximum dopant concentration in the body region, wherein the shielding region and the buried shielding region vertically adjoin one another to provide shielding in each of the lateral first direction, a lateral second direction orthogonal to the lateral first direction, and a vertical direction orthogonal to both the lateral first direction and the lateral second direction.

Example 9. The silicon carbide device of any of examples 1 through 8, wherein the shielding region covers the channel zone over at least 30% but less than 100% of the gate length.

Example 10. A silicon carbide device, comprising: a planar gate structure on a first surface of a silicon carbide substrate, the planar gate structure having a gate length along a lateral first direction; a first source region of a first conductivity type extending under a first side of the planar gate structure over at least part of the gate length; a first body region of a second conductivity type, the first body region including a channel zone that adjoins the first source region under the planar gate structure; a second source region of the first conductivity type extending under a second side of the planar gate structure opposite the first side over at least part of the gate length; a second body region of the second conductivity type, the second body region including a channel zone that adjoins the second source region under the planar gate structure; a current spreading region of the first conductivity type separating the channel zone of the first body region and the channel zone of the second body region from one another under the planar gate structure; and a shielding region of the second conductivity type covering both the channel zone of the first body region and the channel zone of the second body region over at least 20% but less than 100% of the gate length.

Example 11. The silicon carbide device of example 10, wherein the shielding region extends through both the first source region and the second source region in a lateral second direction orthogonal to the lateral first direction, such that the first source region and the second source region are each segmented into a plurality of sections that are separated from one another by the shielding region over at least part of the gate length.

Example 12. The silicon carbide device of example 11, further comprising: a first body contact region of the second conductivity type adjoining both the first body region and the first source region at a side of the first source region opposite the shielding region; and a second body contact region of the second conductivity type adjoining both the second body region and the second source region at a side of the second source region opposite the shielding region, wherein the shielding region merges with the first body contact region between the sections of the first source region, wherein the shielding region merges with the second body contact region between the sections of the second source region.

Example 13. The silicon carbide device of example 12, wherein the current spreading region separates the shielding region into a first section and a second section, wherein the first section of the shielding region extends from the current spreading region to the first body contact region in the lateral second direction, and wherein the second section of the shielding region extends from the current spreading region to the second body contact region in the lateral second direction.

Example 14. The silicon carbide device of example 12, wherein the shielding region extends through the current spreading region in the lateral second direction, such that the shielding region extends uninterrupted between the first body contact region and the second body contact region in the lateral second direction.

Example 15. The silicon carbide device of example 10, wherein both the first source region and the second source region are uninterrupted by the shielding region over the gate length, such that the shielding region is delimited on one side by the first source region and on an opposite side by the second source region.

Example 16. The silicon carbide device of example 15, wherein the shielding region extends through the current spreading region in a lateral second direction orthogonal to the lateral first direction, such that the shielding region extends uninterrupted between the first source region and the second source region in the lateral second direction.

Example 17. The silicon carbide device of example 10, wherein the current spreading region separates the shielding region into a first section and a second section.

Example 18. The silicon carbide device of example 17, wherein the first section of the shielding region is delimited on one side by the first source region and on an opposite side by the current spreading region, and wherein the second section of the shielding region is delimited on one side by the second source region and on an opposite side by the current spreading region.

Example 19. The silicon carbide device of example 17, wherein the first section of the shielding region extends from the current spreading region through the first source region in a lateral second direction orthogonal to the lateral first direction such that the first source region is segmented into a plurality of sections that are separated from one another by the first section of the shielding region over at least part of the gate length, and wherein the second section of the shielding region extends from the current spreading region through the second source region in the lateral second direction such that the second source region is segmented into a plurality of sections that are separated from one another by the second section of the shielding region over at least part of the gate length.

Example 20. The silicon carbide device of any of examples 10 through 19, further comprising: a first buried shielding region of the second conductivity type under both the first body region and the first source region; and a second buried shielding region of the second conductivity type under both the second body region and the second source region, wherein a maximum dopant concentration in the first buried shielding region is higher than the maximum dopant concentration in the first body region, wherein a maximum dopant concentration in the second buried shielding region is higher than the maximum dopant concentration in the second body region, wherein the shielding region and the first buried shielding region vertically adjoin one another to provide shielding in each of the lateral first direction, a lateral second direction orthogonal to the lateral first direction, and a vertical direction orthogonal to both the lateral first direction and the lateral second first direction, wherein the shielding region and the second buried shielding region vertically adjoin one another to provide shielding in each of the lateral first direction, the lateral second direction, and the vertical direction.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A silicon carbide device, comprising:
   a planar gate structure on a first surface of a silicon carbide substrate, the planar gate structure having a gate length along a lateral first direction;
   a source region of a first conductivity type extending under the planar gate structure over at least part of the gate length;
   a body region of a second conductivity type, the body region including a channel zone that adjoins the source region under the planar gate structure; and
   a shielding region of the second conductivity type covering the channel zone over at least part of the gate length,
   wherein a maximum dopant concentration in the shielding region is higher than a maximum dopant concentration in the body region,
   wherein the shielding region extends through the source region in a lateral second direction orthogonal to the lateral first direction, such that the source region is segmented into a plurality of sections that are separated from one another by the shielding region over at least part of the gate length.

2. The silicon carbide device of claim 1, further comprising:
   a body contact region of the second conductivity type adjoining both the body region and the source region at a side of the source region opposite the shielding region,
   wherein a maximum dopant concentration in the body contact region is higher than a maximum dopant concentration in the body region,
   wherein the shielding region merges with the body contact region between the sections of the source region.

3. The silicon carbide device of claim 1, further comprising:
   a current spreading region of the first conductivity type under the planar gate structure and adjoining a side of the channel zone opposite the source region, such that the channel zone is delimited on one side by the source region and on an opposite side by the current spreading region,
   wherein the current spreading region extends from the first surface to a drift zone of the silicon carbide substrate,
   wherein the drift zone extends under both the body region and the source region.

4. The silicon carbide device of claim 3, wherein the shielding region extends through the current spreading region in a lateral second direction orthogonal to the lateral first direction.

5. The silicon carbide device of claim 3, wherein the shielding region is delimited on one side by the source region and on an opposite side by the current spreading region.

6. The silicon carbide device of claim 1, further comprising:
   a buried shielding region of the second conductivity type under both the body region and the source region, wherein a maximum dopant concentration in the buried shielding region is higher than the maximum dopant concentration in the body region,
   wherein the shielding region and the buried shielding region vertically adjoin one another to provide shielding in each of the lateral first direction, a lateral second direction orthogonal to the lateral first direction, and a vertical direction orthogonal to both the lateral first direction and the lateral second direction.

7. The silicon carbide device of claim 1, wherein the shielding region covers the channel zone over at least 30% but less than 100% of the gate length.

8. A silicon carbide device, comprising:
   a planar gate structure on a first surface of a silicon carbide substrate, the planar gate structure having a gate length along a lateral first direction;
   a first source region of a first conductivity type extending under a first side of the planar gate structure over at least part of the gate length;
   a first body region of a second conductivity type, the first body region including a channel zone that adjoins the first source region under the planar gate structure;
   a second source region of the first conductivity type extending under a second side of the planar gate structure opposite the first side over at least part of the gate length;
   a second body region of the second conductivity type, the second body region including a channel zone that adjoins the second source region under the planar gate structure;
   a current spreading region of the first conductivity type separating the channel zone of the first body region and the channel zone of the second body region from one another under the planar gate structure; and
   a shielding region of the second conductivity type covering both the channel zone of the first body region and the channel zone of the second body region over at least part of the gate length,
   wherein the shielding region segments the channel zone of the first body region and the channel zone of the second body region into a plurality of sections below the planar gate structure.

9. The silicon carbide device of claim 8, wherein the shielding region extends through both the first source region and the second source region in a lateral second direction orthogonal to the lateral first direction, such that the first source region and the second source region are each segmented into a plurality of sections that are separated from one another by the shielding region over at least part of the gate length.

10. The silicon carbide device of claim 9, further comprising:
   a first body contact region of the second conductivity type adjoining both the first body region and the first source region at a side of the first source region opposite the shielding region; and
   a second body contact region of the second conductivity type adjoining both the second body region and the second source region at a side of the second source region opposite the shielding region,
   wherein the shielding region merges with the first body contact region between the sections of the first source region,
   wherein the shielding region merges with the second body contact region between the sections of the second source region.

11. The silicon carbide device of claim 10, wherein the current spreading region separates the shielding region into a first section and a second section, wherein the first section of the shielding region extends from the current spreading region to the first body contact region in the lateral second direction, and wherein the second section of the shielding region extends from the current spreading region to the second body contact region in the lateral second direction.

12. The silicon carbide device of claim 10, wherein the shielding region extends through the current spreading region in the lateral second direction, such that the shielding region extends uninterrupted between the first body contact region and the second body contact region in the lateral second direction.

13. The silicon carbide device of claim 8, further comprising:

a first buried shielding region of the second conductivity type under both the first body region and the first source region; and a second buried shielding region of the second conductivity type under both the second body region and the second source region, wherein a maximum dopant concentration in the first buried shielding region is higher than the maximum dopant concentration in the first body region, wherein a maximum dopant concentration in the second buried shielding region is higher than the maximum dopant concentration in the second body region, wherein the shielding region and the first buried shielding region vertically adjoin one another to provide shielding in each of the lateral first direction, a lateral second direction orthogonal to the lateral first direction, and a vertical direction orthogonal to both the lateral first direction and the lateral second direction, wherein the shielding region and the second buried shielding region vertically adjoin one another to provide shielding in each of the lateral first direction, the lateral second direction, and the vertical direction.

14. The silicon carbide device of claim 1, wherein the shielding region covers both the channel zone of the first body region and the channel zone of the second body region over at least 20% but less than 100% of the gate length.

15. The silicon carbide device of claim 8, wherein the shielding region covers both the channel zone of the first body region and the channel zone of the second body region over at least 20% but less than 100% of the gate length.

16. A silicon carbide device, comprising:

a planar gate structure on a first surface of a silicon carbide substrate, the planar gate structure having a gate length along a lateral first direction;

a source region of a first conductivity type extending under the planar gate structure over at least part of the gate length;

a body region of a second conductivity type, the body region including a channel zone that adjoins the source region under the planar gate structure; and a shielding region of the second conductivity type covering the channel zone over at least part of the gate length, wherein a maximum dopant concentration in the shielding region is higher than a maximum dopant concentration in the body region, wherein under the planar gate structure, the shielding region extends to the first surface of the silicon carbide substrate in a vertical direction that is orthogonal to the lateral first direction.

17. The silicon carbide device of claim 16, wherein the source region is uninterrupted by the shielding region over the gate length, such that the shielding region is delimited on one side by the source region.

18. The silicon carbide device of claim 16, further comprising:

a current spreading region of the first conductivity type under the planar gate structure and adjoining a side of the channel zone opposite the source region, such that the channel zone is delimited on one side by the source region and on an opposite side by the current spreading region, wherein the current spreading region extends from the first surface to a drift zone of the silicon carbide substrate, wherein the drift zone extends under both the body region and the source region.

19. The silicon carbide device of claim 18, wherein the shielding region is delimited on one side by the source region and on an opposite side by the current spreading region.

20. The silicon carbide device of claim 18, wherein the current spreading region separates the shielding region into a first section and a second section.

21. The silicon carbide device of claim 16, further comprising:

a body contact region of the second conductivity type adjoining both the body region and the source region, wherein a maximum dopant concentration in the body contact region is higher than a maximum dopant concentration in the body region, wherein the shielding region merges with the body contact region in an area where the shielding region extends to the first surface of the silicon carbide substrate.

22. The silicon carbide device of claim 21, wherein no distinguishable interface is present where the shielding region merges with the body contact region.

* * * * *